United States Patent [19]

Wolfgang et al.

[11] Patent Number: 5,164,666
[45] Date of Patent: Nov. 17, 1992

[54] METHOD AND APPARATUS FOR ANALYZING ERRORS IN INTEGRATED CIRCUITS

[75] Inventors: Eckhard Wolfgang, Munich; Klaus Zibert, Holzkirchen, both of Fed. Rep. of Germany

[73] Assignee: ICT Integrated Circuit Testing Gesellschaft für Halbeleiterprüftechnik mbH, Fed. Rep. of Germany

[21] Appl. No.: 753,555

[22] Filed: Jul. 10, 1985

[30] Foreign Application Priority Data

Oct. 12, 1984 [DE] Fed. Rep. of Germany ...... 3437550

[51] Int. Cl.⁵ ............................................ G01R 31/28
[52] U.S. Cl. ................................ 324/158 R; 324/73.1; 364/579
[58] Field of Search ............ 324/73 R, 73 PC, 158 R, 324/96; 340/707; 364/483, 190, 491, 579; 250/492.2

[56] References Cited

U.S. PATENT DOCUMENTS 4,538,065 8/1985 Miyoshi et al. ................ 324/158 R

FOREIGN PATENT DOCUMENTS 81295 6/1983 European Pat. Off. ........ 324/158 R

OTHER PUBLICATIONS

"Electron Beam Testing Methodology", P. Fazekas and Wolfgang, 1983 IEEE, pp. 26-31.
Elektronenstrahl-Besstechnik zur Prufung Integrierter Schaltungen Physik-Verlag 38 (1982) No. 8, pp. 253-258.
Electron Beam Measurements in Practice, Fazekas, Fox, Papp, Widulla and Wolfgang, Scanning Electron Microscopy 1983/IV, pp. 1595-1604, Sem Inc.
IBM Technical Disclosure Bulletin, De Stafeno et al., "Voltage Comparator System for Contactless...", vol. 17, No. 10, Mar. 1975, pp. 2871-2873.

*Primary Examiner*—Stephen M. Baker
*Attorney, Agent, or Firm*—Hill, Van Santen, Steadman & Simpson

[57] ABSTRACT

Method and apparatus for analyzing errors or failures in integrated circuits wherein the integrated circuit is displayed on the picture screen of a work station (AS) and the circuit is excited with a test signal such that at least one measuring location is selected on a malfunction path and an actual signal tappable at this measuring location is compared to a rated signal and wherein the fault location is identified from the comparison results at the measuring locations. The object is to execute a method using an electron beam testing apparatus (EMG) such that the simplest possible measured data transfer occurs. For this purpose the selection of the measuring location on the malfunctioning path proceeds such that a portion (23) of the layout of the integrated circuit corresponding to the measuring location is displayed on the picture screen of the work station and the measuring location is marked by a cursor (24) and position signals depending on the positon of the cursor (24) are supplied to the electron beam measuring apparatus for aligning the electron beam (2) to the measuring location and such that the electron beam testing apparatus is utilized for the identification of the actual signal.

23 Claims, 1 Drawing Sheet

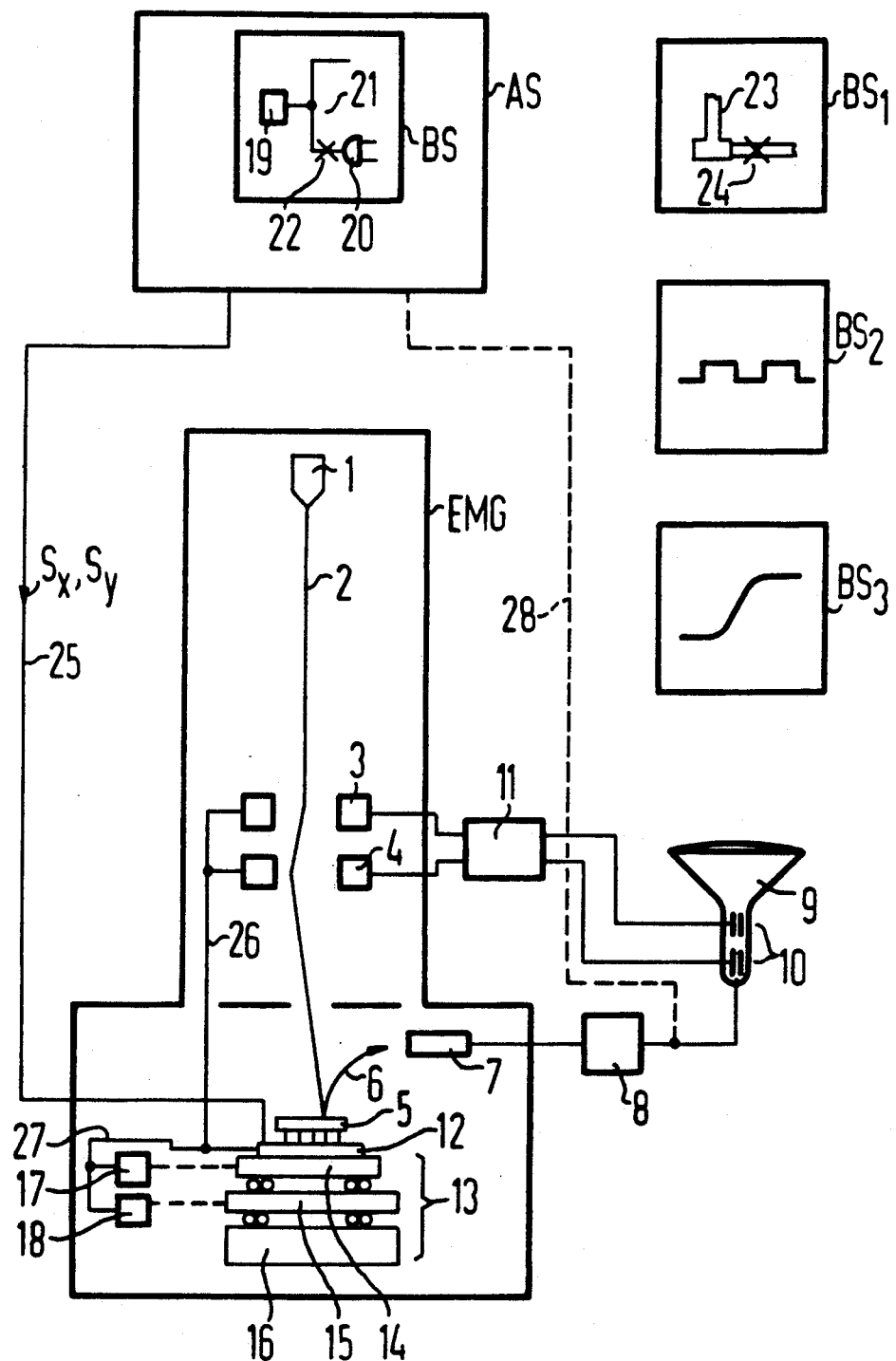

METHOD AND APPARATUS FOR ANALYZING ERRORS IN INTEGRATED CIRCUITS

BACKGROUND OF THE INVENTION

1. Field of the Invention

This invention relates in general to apparatus and methods for testing and identifying failures in integrated circuits.

2. Description of the Prior Art

Work stations are known in the prior art and are explained, for example, in the special issue CADCAM of the periodical "Elektronik", Vol. 18 dated Sep. 7, 1984 pages 165-169. Work station computers can be utilized in for example design of monolithically integrated circuits both in producing and displaying the circuit diagram as well as for logical simulations of the circuit and for producing the layout.

Electron beam testing apparatus and electron beam testing methods for failure analysis in integrated circuits are known as disclosed for example in Scanning Electron Microscopy 1983/IV, at pages 1595-1604 from the conference volume of the IEEE Computer Society, Test Technology Committee, 16th and 17th of Nov. 1983 (Curriculum for Test Technology, Minneapolis), pages 26-31 as well as from the Phys. B1 38 (1982) No. 8, pages 253-258.

SUMMARY OF THE INVENTION

It is an object of the present invention to provide a method and apparatus which utilizes a work station and electron beam testing apparatus wherein the simplest possible measure data transfer between the work station and the electron beam testing apparatus occurs wherein the selection of a measuring location on the malfunction path occurs such that at least a part of the layout of the integrated circuit corresponding to this measuring location and its environment is displayed on a picture screen of the work station and the measuring location is marked with a cursor on the illustrated part of the layout and position signals depending on the position of the cursor are derived which are supplied to an electron beam testing apparatus containing the integrated circuit which is the specimen and the beam is aligned to the measuring location and the electron beam testing apparatus is utilized for ascertaining the actual signal associated with the measuring location.

The advantage obtainable with the invention is particularly comprised in that the measured data required for the implementation of the method in the electron beam testing apparatus, for example, the coordinates of the individual measuring locations on the chip of the integrated circuit are derived in a particularly simple fashion from the circuit data residing in the work station and are made available on the electron beam testing equipment.

Other objects, features and advantages of the invention will be readily apparent from the following description of certain preferred embodiments thereof taken in conjunction with the accompanying drawings although variations and modifications may be made without departing from the spirit and scope of the novel concepts of the disclosure and in which:

BRIEF DESCRIPTION OF THE DRAWINGS

The drawing comprises a block schematic view of the failure analyzing apparatus for testing integrated circuits according to the invention.

DESCRIPTION OF THE PREFERRED EMBODIMENTS

The FIG. illustrates a work station AS which is equipped with a picture screen BS. An electron beam testing apparatus EMG comprises an electron beam generator 1 which produces an electron beam 2 which passes through two deflection systems 3, 4 which deflect the beam in two coordinate directions which are orthogonal relative to each other. The beam 2 impinges on the surface of an integrated circuit 5 which might comprise a chip and an error or failure analysis is to be accomplished on the circuit 5. Secondary electrons are emitted from the surface of the circuit 5 when the electron beam impinges thereon at the locations where the electron beam 2 impinges and these secondary emissions travel in the direction of arrow 6 and are detected by a detector 7. The detector 7 produces a signal from which a control signal for a picture tube 9 is derived in a signal processing unit 8. The beam deflection system of the picture tube 9 is designated by 10. The beam deflection systems receive inputs from a scan generator 11 which also drives the deflection systems 3 and 4 with deflection voltages.

The integrated circuit 5 which may be referred to as a test specimen is contained in a test bed (bread board) 12 which is mounted on an x-y table 13. The x-y table 13 is composed of parts or members 14, 15 and 16 with the part 14 mounted on part 15 and with the part 14 being displaceable in a first parallel deflection direction x. The part 15 is displaceable in a second parallel deflection direction y on the stationary base or bottom part 16. Drive apparatuses 17 and 18 are respectively connected to parts 14 and 15 so as to move them in the x and y directions.

Electron lenses which are required for focusing the electron beam 2 are not shown in the drawing for the sake of simplicity and also since they are well known to those skilled in the art.

In order to test for error or failure analysis on the monolithically integrated circuit 5 the following procedure is utilized: First, the circuit diagram of the circuit 5 which is found to be faulty is displayed on the picture screen BS. By means of a trouble shooting algorithm which sequences the work station AS and which is executed by the employment of test bit patterns (stimuli) which are stored in the work station, a malfunctioning path is emphasized with respect to the remaining portions of the circuit diagram. In the FIG. it is indicated for example, that a malfunctioning path 21 lying between a subcircuit 19 and an AND gate 20 is extracted and indicated on the picture screen BS.

Expediently, a check is then accomplished at a plurality of measuring locations on this particular malfunctioning path by means of the electron beam testing apparatus to determine whether the error or fault appears or does not appear. Such measuring locations are particularly distributed over the malfunctioning paths such that they respectively lie in the region of a branching point. The selection of such measuring locations occurs in a fashion such that it is first marked on the illustrated part of the malfunctioning path as a part of the circuit diagram by means of a cursor 22 or by a trouble shooting algorithm. Subsequently, that part of the layout of the integrated circuit which corresponds to the measuring location is marked and identified by the cursor 22 and then its immediate environment is displayed on the picture screen BS isolated from the remaining layout. This is indicated in the drawing by the view $BS_1$ of the picture tube BS. The transition from the illustrated parts 19 through 21 of the circuit diagram to the illustrated layout part 23 occurs in the work station by means of a preceding "electrical rule check" or, respectively, by a reconstruction of the topology from the topography. The measuring location is then marked on the illustrated layout part 23 by a cursor 24.

Depending upon the position of the adjustable cursor 24, the work station then generates position signals $S_x$ and $S_y$ which are supplied through a line group to the bread board 12. By way of a circuit provided on the bread board which represents a periphery circuit with respect to the circuit 5 under investigation and serves among other things for the drive of the circuit 5, control signals are derived from $S_x$ and $S_y$ which are supplied in one instance by way of lines 26 to the deflection means 3 and 4 and also by way of lines 27 to the drive units 17 and 18. These control signals cause the alignment of the electron beam 2 to the selected measuring location on the chip of the integrated circuit 5. The setting of the parts 14 and 15 thus serves as a rough setting and the deflection of the electron beam by means of the deflection systems 3 and 4 serve as a fine adjustment. A rough adjustment can also be omitted under certain conditions depending on the position of the measuring location on the chip.

The integrated circuit 5 is fed by test signals which are generally present in the form of bit patterns and are likewise supplied from the work station AS by way of the line group 25. These can also be transmitted by means of a PIN electronic system at a significantly higher frequency band before they proceed to circuit 5.

The electron beam 2 which has been aligned to the measuring location causes the emission of a number of secondary electrons which depend on the voltage at the measuring locations so that a voltage curve which is referred to as the actual signal is acquired by the detector 7 and the signal processing unit 8 with the amplitude respectively reflecting the voltage appearing at the measuring location. The time relationship of the actual signal can be displayed on the picture tube 9. For this purpose it is sufficient that the scan generator 11 merely influences the time deflection of the writing electron beam of the picture tube 9 whereas the signal acquired by way of the signal processing unit 8 causes an excursion of the time axis thus described. Alternatively, the actual signal can also be supplied by way of a line 28 to the work station AS and can be displayed on the picture screen BS.

In the work station AS, a rated signal which is allocated to the measuring location under observation is generated by means of a logic simulation and is displayed on the picture screen BS in terms of its time dependency as illustrated in view $BS_2$. A comparison of the actual signal to the rated signal indicates in a simple manner whether the fault or error is present at the particular fault location.

According to a further development of the method of the invention, the actual signal can be displayed with a time spread such that the transition from the lower voltage value to the upper voltage value becomes clearly visible. For comparison, a rated signal that is generated in the work station by a transient simulation is employed. Such a rated signal may be derived from a view $BS_3$ of the screen BS.

When the actual signal and the rated signal are compared to each other on the picture screen BS it is expedient to clearly distinguish one signal from the other by means of color contrast. A differential signal that indicates the size of the mutual deviation can also be formed from the two signals in the work station AS.

For investigating a specific malfunction path a part of a test signal which for example is composed of a long bit pattern can also be extracted therefrom at the work station AS which produces certain advantages. The test signal is thus divided and its extracted portion is then periodically supplied to the integrated circuit 5 by way of the line group 25.

When the actual signal acquired at the measuring location defined by the cursors 22 and 24 does not agree with the rated signal corresponding to $BS_2$ or $BS_3$ then a measuring error is present at this location. When the remaining measuring locations are investigated in an analogous manner, then the conclusion can be drawn that the measuring error can be localized on the malfunction path between a measuring location which still allows the measuring error to be recognized and a following measuring location at which it no longer appears.

The actual signals, the rated signals and the comparison signals which may be derived from such two signals allocated to the integrated circuit 5 can be stored in the work station or can also be supplied as output to printers, platters or other peripheral equipment.

It is seen that the present invention provides a novel and simple manner for testing for errors and failures in integrated circuits and although it has been described with respect to preferred embodiments, it is not to be so limited as changes and modifications may be made which are within the full intended scope as defined by the appended claims.

We claim as our invention:

1. A method for error or failure analysis of an integrated circuit specimen having a plurality of circuit layouts which are design layouts, wherein such circuit specimen is displayed on the picture screen of a work station and wherein the circuit specimen is energized with at least one test signal and wherein at least one measuring location is selected on a malfunctioning path which is found to be faulty and an actual signal tappable at said measuring location is compared to a rated signal, and wherein the fault location on the malfunction path is ascertained from the comparison results at the measuring locations, comprising the steps of displaying on a picture screen (BS) at the work station (AS) the selection of a measuring location on the malfunction path on at least that part of one of said design layouts (23) of the integrated circuit specimen corresponding to said measuring location, marking with a cursor (24) on the illustrated part of said one of said design layout (23) the measuring location, and deriving position signals dependent on the cursor position, supplying said position signals to an electron beam testing apparatus (EMG) containing the integrated circuit specimen for the alignment of the electron beam to the measuring location, and utilizing the electron beam testing apparatus for ascertaining the actual signal at the measuring location.

2. A method according to claim 1, characterized in that the measuring locations are selected such that they lie at the branchings of the malfunction path.

3. A method according to claim 1, characterized in that the position signals are supplied to the deflection devices (3, 4) and/or to the controllers of the drive devices (17, 18) of the displaceably table (13) of an electron beam testing apparatus (EMG) which contains said integrated circuit specimen.

4. A method according to claim 1, characterized in that the rated signal which is compared to the tapped actual signal is obtained in the work station (AS) by means of a logic simulation.

5. A method according to claim 1, characterized in that the rated signal which is compared to the tapped actual signal is obtained in the work station by means of a transient simulation.

6. A method according to claim 1, characterized in that the rated signal is composed of a first voltage curve formed in the work station which is displayed on a visual display, particularly on the picture screen of the work station; and in that the actual signal is composed of a second voltage curve which is displayed in contrast to the first voltage curve, being particularly displayed on the same visual voltage curve, being particularly displayed on the same visual display.

7. A method according to claim 1, characterized in that the actual signals, rated signals and comparison signals which are formed from said actual and said rated signals which are developed by said integrated circuit specimen are stored in the work station.

8. A method according to claim 7, characterized in that the actual signals, rated signals and/or comparison signals stored in the work station are output to a printer, plotter or other output device.

9. A method according to claim 1, characterized in that the test signal is composed of a test bit pattern.

10. A method according to claim 9, characterized in that the test signal is composed of a part of the test bit pattern which is formed in the work station.

11. A method for error or failure analysis of an integrated circuit specimen having a plurality of circuit layouts, wherein such circuit specimen is displayed on the picture screen of a work station and wherein the circuit specimen is energized with at least one test signal and wherein at least one measuring location is compared to a rated signal, and wherein the fault location on the malfunction path is ascertained from the comparison results at the measuring locations, comprising the steps of displaying on a picture screen (BS) at the work station (AS) the selection of a measuring location on the malfunction path on at least that part of one of said layouts (23) of the integrated circuit specimen corresponding to said measuring location, marking with a cursor (24) on the illustrated part of said one of said layouts (23) the measuring location, and deriving position signals dependent on the cursor position, supplying said position signals to an electron beam testing apparatus (EMG) containing the integrated circuit specimen for the alignment of the electron beam to the measuring location, and utilizing the electron beam testing apparatus for ascertaining the actual signal at the measuring location, and characterized in that, for the selection of the measuring location, displaying the circuit diagram of the integrated circuit specimen on the picture screen (BS) of the work station, marking the measuring location on the circuit diagram, displaying in that part of the layout (23) of the integrated circuit specimen corresponding to the marked measuring location and its environment, and marking the measuring location by the cursor (24) in such part of the layout (23).

12. A method according to claim 11, characterized in that, after the recognition of a malfunction path, the display of the circuit diagram is essentially limited to said malfunction path.

13. A method according to claims 11 or 12, characterized in that the measuring locations are selected such that they lie at the branchings of the malfunction path.

14. A method according to claims 11 or 12, characterized in the the position signals are supplied to the deflection devices (3, 4) and/or to the controllers of the drive devices (17, 18) of the displaceably table (13) of an electron beam testing apparatus (EMG) which contains said integrated circuit specimen.

15. A method according to one of the claims 11 or 12. characterized in that the rated signal which is compared to the tapped actual signal is obtained in the work station (AS) by means of a transient simulation.

16. A method for error or failure analysis of an integrated circuit specimen having a plurality of circuit layouts, wherein such circuit specimen is displayed don the picture screen of a work station and wherein the circuit specimen is energized with at least one test signal and wherein at least one measuring location is compared to a rated signal, and wherein the fault location on the malfunction path is ascertained from the comparison results at the measuring locations, comprising the steps of displaying on a picture screen (BS) at the work station (AS) the selection of a measuring location on the malfunction path on at least that part of one of said layouts (23) of the integrated circuit specimen corresponding to said measuring location, marking with a cursor (24) on the illustrated part of said one of said layouts (23) the measuring location, and deriving position signals dependent on the cursor position, supplying said position signals to an electron beam testing apparatus (EMG) containing the integrated circuit specimen for the alignment of the electron beam to the measuring location, and utilizing the electron beam testing apparatus for ascertaining the actual signal at the measuring location, and characterized in that the test signal supplied to the integrated circuit specimen (5) from the work station (AS) is converted into a higher frequency with an electronic circuit.

17. A method according to one of the claims 11 or 12, characterized in that the rated signal is composed of a first voltage curve formed in the work station which is displayed on a visual display, particularly on the picture screen of the work station; and in that the actual signal is composed of a second voltage curve which is displayed in contrast to the fist voltage curve, being particularly displayed on the same visual display.

18. A method according to claims 11 or 12, characterized in that the test signal supplied to the integrated circuit specimen (5) from the work station (AS) is converted into a higher frequency with an electronic circuit.

19. A method according to one of the claims 11 or 12, characterized in that the test signal is composed of a test bit pattern.

20. A method according to claim 19, characterized in that the test signal is composed of a part of the test bit pattern which is formed in the work station.

21. A method according to claim 12, characterized in that a scanning electron microscope is employed as the electron beam testing apparatus (EMG), said scanning electron microscope being set up for taking voltage values at individual measuring points of an integrated circuit specimen (5).

22. A method according to one of the claims 11, or 21, characterized in that the position signals are derived via a test bed breadboard (12) containing the integrated circuit specimen.

23. A method according to one of the claims 11 or 21, characterized in that the rated signal which is compared to the tapped actual signal is obtained in the work station (AS) by means of a logic simulation.

* * * * *